United States Patent [19]

Briner

[11] Patent Number: 5,721,702
[45] Date of Patent: Feb. 24, 1998

[54] REFERENCE VOLTAGE GENERATOR USING FLASH MEMORY CELLS

[75] Inventor: Michael S. Briner, San Jose, Calif.

[73] Assignee: Micron Quantum Devices, Inc., Santa Clara, Calif.

[21] Appl. No.: 509,737

[22] Filed: Aug. 1, 1995

[51] Int. Cl.[6] .................................................. G11C 16/06
[52] U.S. Cl. ........................ 365/185.21; 365/185.3; 365/185.09
[58] Field of Search ...................... 365/185.3, 189.09, 365/185.21

[56] References Cited

U.S. PATENT DOCUMENTS

| | | | |
|---|---|---|---|
| 5,335,198 | 8/1994 | Van Buskirk et al. | 365/185.3 |
| 5,339,272 | 8/1994 | Tedrow et al. | 365/189.09 |
| 5,477,499 | 12/1995 | Van Buskirk et al. | 365/185.3 |

Primary Examiner—Joseph E. Clawson, Jr.
Attorney, Agent, or Firm—Limbach & Limbach L.L.P.

[57] ABSTRACT

First and second flash memory cells or transistors, operating in the linear region of operation, are provided with different threshold values by providing different charges on their respective floating gates. The first of the pair of flash memory transistors is "over-erased" until it has a negative threshold voltage so that the first flash memory transistor is rendered permanently conducting when its control gate and source are at $V_{ss}$. Circuitry is provided for connecting the first and second flash memory transistors in parallel circuits in which equal current values are generated in an equilibrium condition. Circuitry for sensing a voltage in each of the parallel circuits is provided to determine any imbalance in current values and provide an output voltage which may be used as an reference value when the currents are in equilibrium. Circuitry is provided for sensing variations in the output voltage to vary the current through one of the flash memory transistors to bring the currents into equilibrium when the output voltage varies from the reference value provided at equilibrium. The control gate of the first (over-erased) flash memory transistor is connected to the system ground, $V_{ss}$ to further increase the stability of the reference voltage generator.

6 Claims, 4 Drawing Sheets

REFERENCE VOLTAGE GENERATOR USING FLASH MEMORY CELLS

BACKGROUND OF THE INVENTION

1. Field of the Invention

This invention relates to a reference voltage generator, and in particular to a stable reference voltage generator utilizing flash memory transistors which is particularly applicable for flash memory applications.

2. Description of Related Art

There are many applications for voltage reference generators which are stable regardless of changes in ambient temperature and supply voltage. Such devices have application in oscillator, timer and voltage regulation circuitry.

Flash memory arrays with precise on-chip voltage regulation require stable voltage references. Typically, voltage reference generators are fabricated as a part of the fabrication of the flash memory integrated circuit array. It is therefore desirable for such a reference voltage generator to be constructed using the same CMOS fabrication techniques utilized for making the remainder of the flash memory array.

One such reference voltage generator which uses flash memory cells in conjunction with a flash memory array is described in U.S. Pat. No. 5,339,292 entitled "Precision Voltage Reference." This patent describes a voltage reference circuit which includes a pair of flash memory cells, each having a different charge on the respective floating gates. Circuitry is provided for connecting each of the flash cells in parallel circuits in which equal currents are generated in an equilibrium condition. A circuit is provided for generating a voltage indicative of the current in each of the pair of parallel circuits. A differential amplifier responsive to the voltages in the parallel circuits, provides an output voltage to vary the current through the flash memory cells to bring the currents through the respective parallel paths into equilibrium, and to maintain constant reference voltage.

SUMMARY OF THE INVENTION

It is therefore an object of the present invention to provide a precision voltage reference for a MOS or CMOS integrated circuit which contains flash memory cells.

Another object of the present invention is to provide a stable voltage reference generator, for use in a flash memory array, which uses flash memory cells as a part of the reference voltage generator circuitry.

Another object of the invention is to provide a reference voltage generator which is more stable with temperature and power variations then previous reference voltage generators utilizing flash memory cells.

Another object of the invention is to provide a reference voltage generator, using flash memory cells, wherein the magnitude of the reference voltage is determined by the difference in threshold values of the respective flash memory cells.

These and other objects of the present invention are realized in a reference voltage generator utilizing flash memory cells, each having a source, drain, floating gate and control gate. First and second flash memory cells or transistors, operating in the linear region of operation, are provided with different threshold values by providing different charges on their respective floating gates. The first of the pair of flash memory transistors is "over-erased" until it has a negative threshold voltage, so that the first flash memory transistor is rendered permanently conducting.

Circuitry is provided for connecting the first and second flash memory transistors in parallel circuits in which equal current values are generated in an equilibrium condition. Circuitry for sensing a voltage in each of the parallel circuits is provided to determine any imbalance in current values and provide an output voltage which may be used as an reference value when the currents are in equilibrium. If variations in the output voltage are sensed the currents through the flash memory transistors are varied to bring the currents into equilibrium.

In the over-erased state the first flash memory transistor is permanently conducting. This is important in maintaining stable conditions regardless of changes in ambient temperature and power supply variations.

In accordance with another aspect of the invention, the control gate of the first (over-erased) flash memory transistor is connected to the system ground, $V_{ss}$. This further increases the stability of the reference voltage generator of the present invention.

In accordance with another aspect of the invention, the charges on the floating gates of the first and second flash memory transistors are maintained and not disturbed. This is accomplished by keeping the first and second flash memory transistors in the linear region of operation by providing appropriate biasing circuitry and keeping the source/drain voltage stable and small.

DETAILED DESCRIPTION OF THE INVENTION

A reference voltage is very desirable in many circuit designs. It has application in oscillator, timer and voltage regulation circuitry. It is desirable that the reference voltage be as stable as possible despite variations in processing, temperature and the power supply voltage.

Having a very stable reference voltage is a requirement in flash memory arrays with on-chip voltage regulation. Flash memory arrays have the advantage that they retain information stored in individual flash memory cells or transistors without the requirement of external power. Additionally, they can be programmed or re-programmed electrically.

Flash memory arrays with on-chip voltage regulation require a stable voltage reference for many of the operations within the array. Typically, it is necessary to provide a reference voltage source or generator as a part of the memory array itself. This requires that the precision voltage reference generator be producible with the processes used for manufacturing the control circuitry of the flash memory array. Typically, the process which is used for flash memory arrays is the conventional CMOS process.

Figure 1:
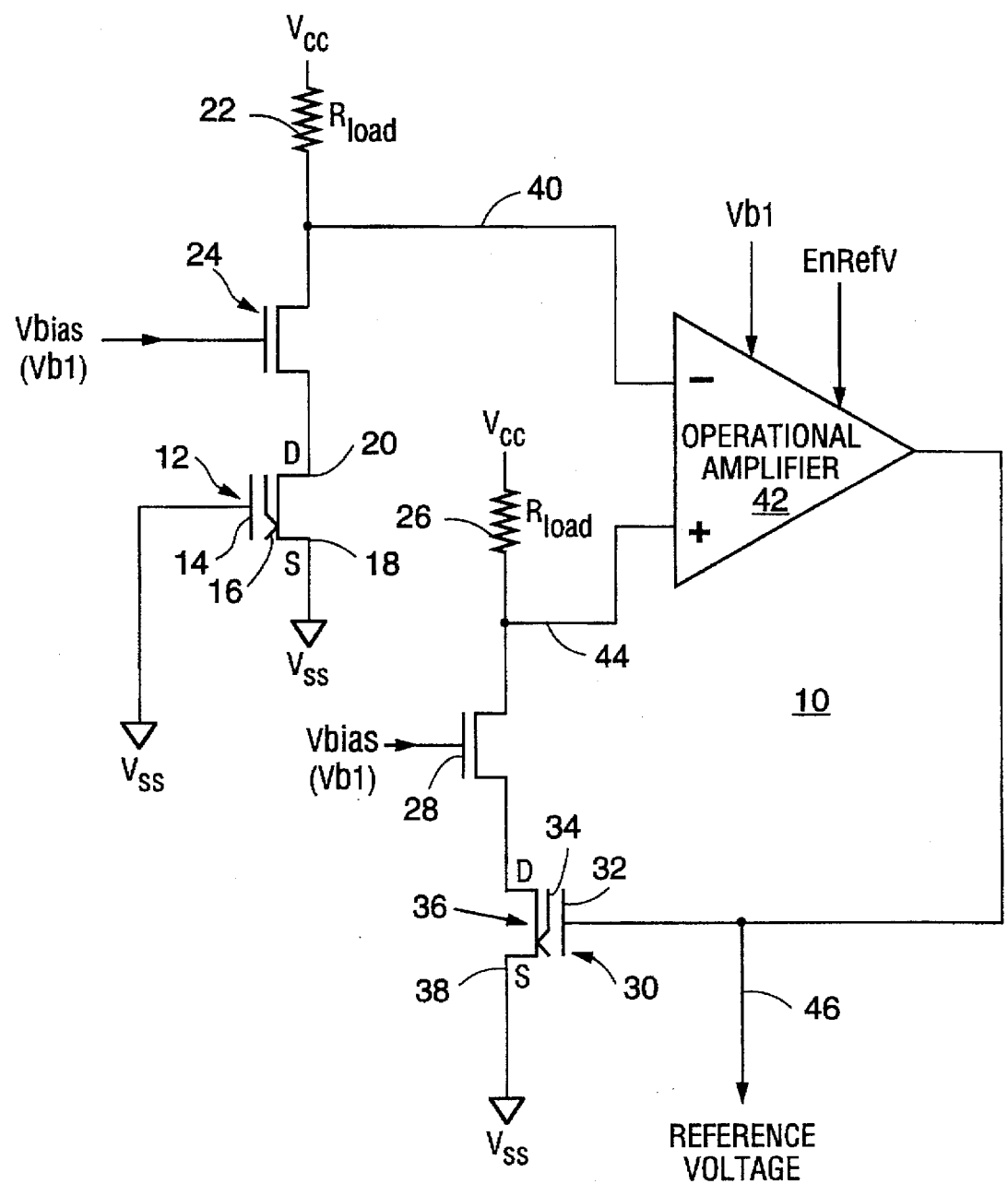
FIG. 1 is a block diagram of the reference voltage generator of the present invention.

FIG. 1 is a schematic diagram of a reference voltage generator 10 in accordance with the present invention. A first flash memory cell or transistor 12 is provided which has a control gate 14, a floating gate 16, a source 18 and a drain 20. It is to be noted that the control gate 14, as well as the source 18, are connected to $V_{ss}$ which is the ground line for the memory array. As a result, the control gate bias is rendered extremely stable which is a very important for providing a voltage reference generator which is stable despite variations in temperature and power supply.

The first flash memory transistor 12 is initially "over-erased" until it has a negative threshold voltage. The term threshold voltage is used herein to mean the control gate-source voltage required to cause the transistor to conduct 1 microampere for a drain-source voltage of +0.1 volt. Over-erase occurs by depleting the charge on the floating gate 16 until the flash transistor 12 is rendered permanently conducting with zero volts between the control gate and the source and requires a negative voltage on the control gate relative to the source to turn the flash cell off (depletion mode operation). Such "over-erasing" is normally not desirable for a memory cell and is prevented when normal erasing of a flash memory cell takes place. This is because a memory cell which is conducting while not being selected can cause bit-line leakage currents which make it impossible to properly sense the read currents on the other cells on that bit-line. Here, however, being permanently conducting helps to increase the stability of the reference voltage generator.

The second flash memory transistor 30 is erased initially and then is programmed until it has a threshold that is more positive than flash memory transistor 12. As will be explained in greater detail later, it is the difference in threshold voltages between transistor 12 and 30 which determines the magnitude of the resulting reference voltage.

Loads 22 and 26 connected to the supply voltage $V_{cc}$ provide a means of converting the currents flowing through the respective first and second flash transistors 12 and 30 to voltages which are compared through the negative and positive inputs of operational amplifier 42. Biasing of first and second flash transistors 12 and 30 is provided by means of biasing transistors 24 and 28, as is explained later.

The combination of the supply voltage $V_{cc}$, the load 22, N-channel biasing transistor 24 and flash memory transistor 12 form a first of two parallel circuits. A second of two parallel circuit includes the supply load 26 connected to supply voltage $V_{cc}$, biasing transistor 28, second flash memory transistor 30. The first parallel circuit is connected by line 40 to one input of operational amplifier 42 and the second parallel circuit is connected to the other input of operational amplifier 42 by line 44.

As explained, the currents through the first and second memory cells 12 and 30 in the first and second parallel circuits are converted to voltages and compared by the operational amplifier 42. The output of this differential amplifier 42 is fedback to the control gate 32 of the second transistor 30, thus providing negative feedback to the control gate 32. Any change in currents through the respective flash memory transistors will result in a voltage difference at the inputs to operational amplifier 42. The output of the operational amplifier 46 ($V_{ref}$) will provide a signal to the control gate 32 of transistor 30 which will either increase or decrease the current through transistor 30 to bring the currents through transistors 12 and 30 back to their equilibrium conditions to equalize the voltages at the inputs of operational amplifier 42.

Flash cells 12 and 30 and biasing transistors 24 and 28 and loads 22 and 26 are of identical construction. If this is done, then the currents through the two flash memory transistors 12 and 30 will seek the same value. This will occur when the floating gates 16 and 34 are at the same voltages. Since transistors 12 and 30 are initially programmed to different initial voltages on their floating gates 16 and 34 respectively, the control gate 32 of transistor 30 will seek a voltage level which couples voltage onto its floating gate 34 until it is equal to the voltage of the floating gate 16 of flash memory transistor 12. This voltage 46 on the control gate 32 of flash transistor 30 will remain stable with temperature and supply voltage.

Reference voltage 46 ($V_{ref}$) can be used as a reference voltage and should not change provided the charges on the floating gates 16 and 34 are not disturbed. An important aspect of the present invention is to minimize disturbance to the charge on the floating gates which can be caused, for example, by either a high gate or high drain voltage. Flash memory transistors 12 and 30 must be kept from going into saturation since it is possible under saturation conditions for hot electrons to be attracted to the floating gates 16 and 34 which would disturb the charges thereon.

Transistors 12 and 36 are therefore kept in the linear region of operation by the use of biasing transistors 24 and 28. The linear region is defined as that region where the drain-source voltage of the flash transistor is less than the magnitude of the difference between the control gate-source voltage and the threshold voltage. Transistors 24 and 28 function to maintain the drains of flash memory transistors at a voltage equal to the $V_{bias}$ less the threshold voltage of the two transistors 24 and 28. More specifically, $V_{bias}$ is chosen to bias the drains of flash memory transistors 12 and 30 at approximately +0.1 to +0.2 volts or less.

The floating gate 16 of flash memory transistor 12 is discharged (overerased) to about +1.0 volts and the floating gate 34 of flash memory transistor 30 is charged (programmed) to about −0.4 volts. With a coupling ratio of control gate to floating gate on the flash cells 12 and 30 of around 0.66, the resulting reference voltage 46 at the control gate 32 of transistor 30 is then about +2.1 volts [(1.0V−(−0.4V))/0.66]. This is the effective threshold voltage difference between the two flash memory cells 12 and 30 as measured at their respective control gates. At these voltage levels the possibility of disturbing the charges on the floating gates is minimal. Note that any charge loss or gain on either of the floating gates 16 or 34 will result in a change in the reference voltage 46. Therefore it is important to maintain the flash memory cells biased at a low drain voltage.

It should also be noted that the magnitude of the reference voltage 46 is adjustable by changing the difference in threshold voltages of the flash cells 12 and 30, i.e., by adjusting the voltage levels of the respective floating gates 16 and 34.

Figure 2:
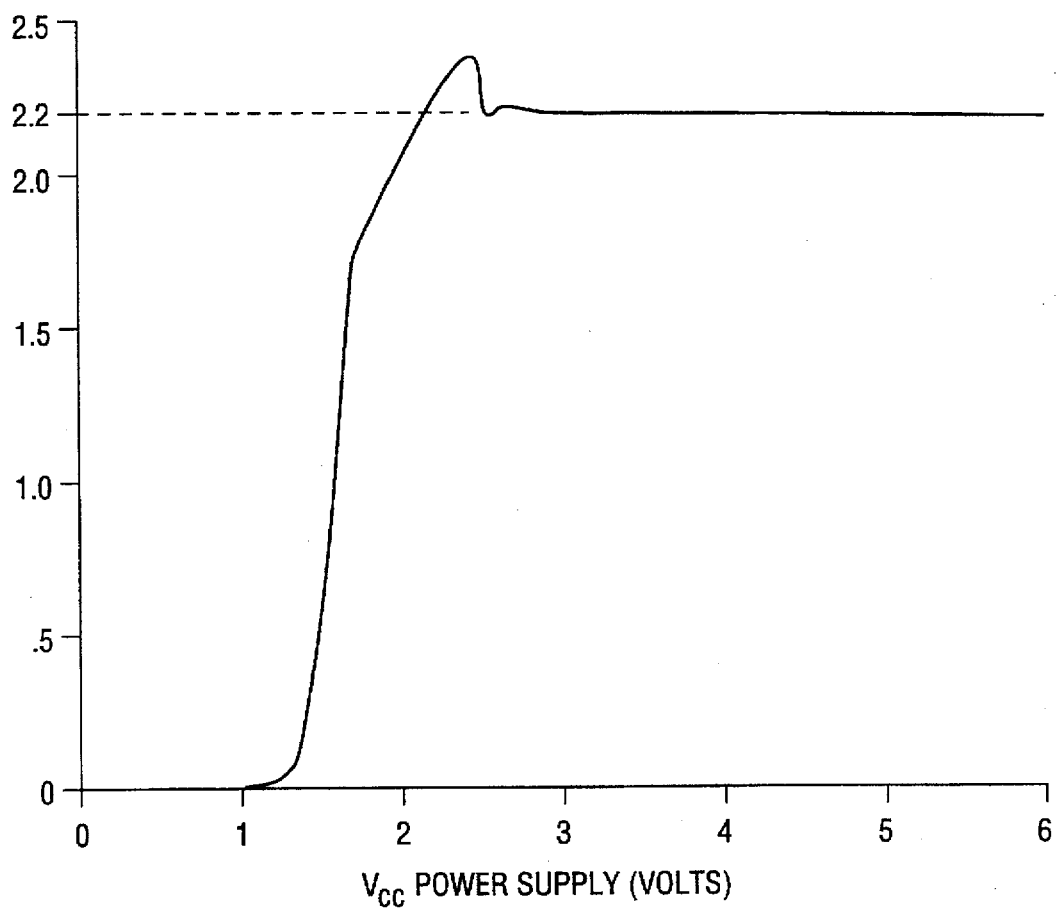
FIG. 2 shows the reference voltage output, of the subject reference voltage generator, as a function of $V_{cc}$, the power supply.

FIG. 2 is a plot of the reference voltage 46 in the example described above as a function of the power supply voltage, $V_{cc}$. Note that so long as the power supply exceeds a minimum value, here approximately 2.5 volts, that the reference voltage 46 is maintained at a very stable 2.2 volts.

Figure 3A:
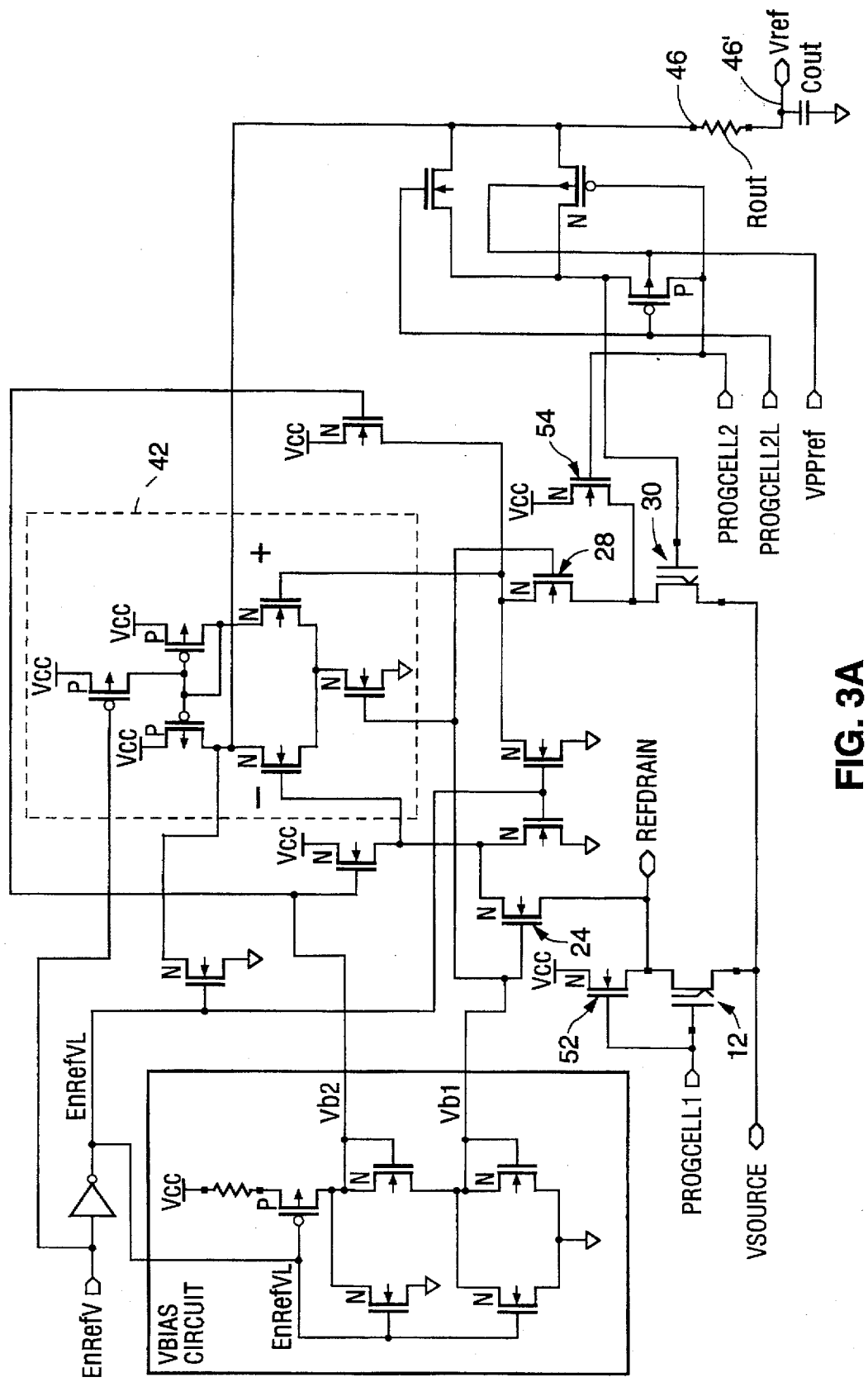
FIG. 3A illustrates details of the reference generator and biasing circuitry of the present invention.
Figure 3B:
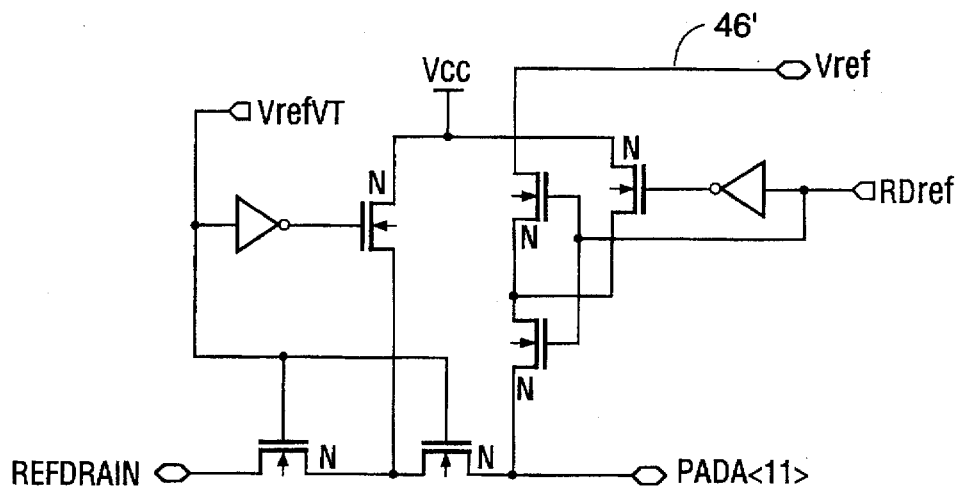
FIG. 3B illustrates details of the read circuitry of the present invention.
Figure 3C:
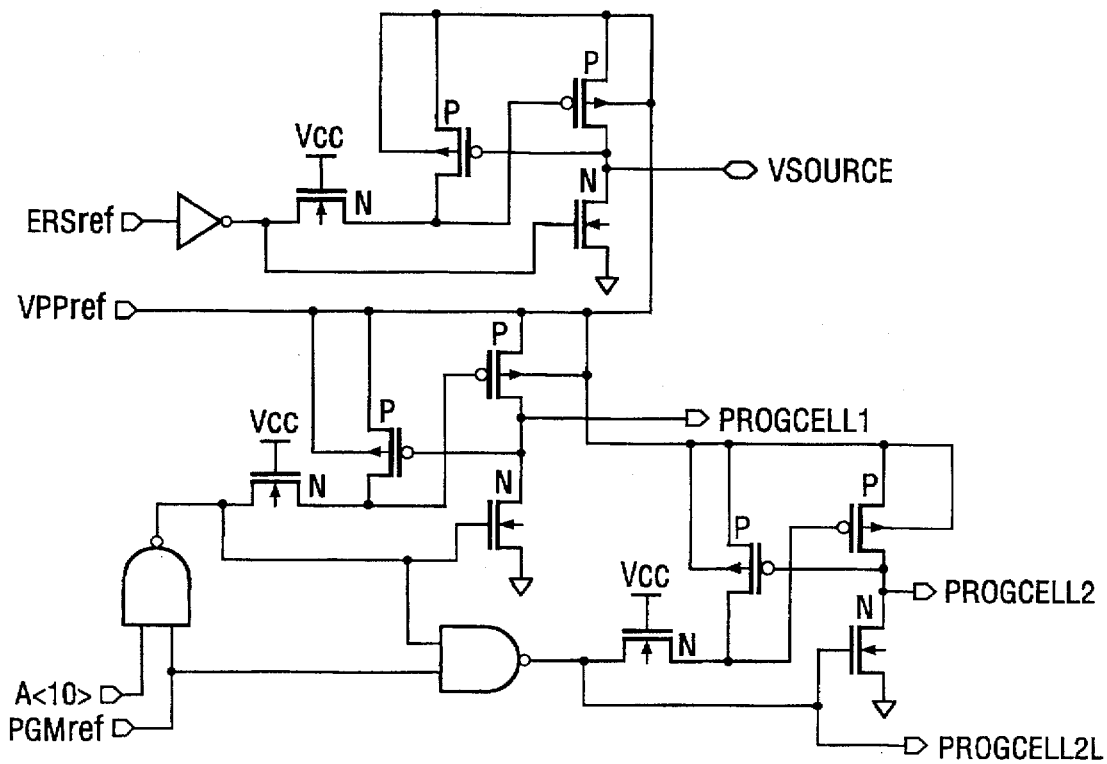
FIG. 3C illustrates details of the write circuitry of the present invention.

FIGS. 3A, 3B and 3C are more detailed schematic diagrams of the present invention. The same reference numerals used in FIG. 1 are used in FIGS. 3A–3C. FIG. 3A illustrates details of the reference generator 10 and $V_{bias}$ circuitry of the present invention. $V_{ref}$ is the reference voltage output 46'. Nodes 46 and 46' are the same d.c. voltage, $V_{ref}$, however, the resistor $R_{out}$ in combination with the capacitance load $C_{out}$, acts as a RC dampening circuit on power up to avoid overshoot at node 46'. As explained above, this voltage is equal to the threshold voltage difference of the two flash cells 12 and 30. EnRefV is the "Enable Reference Voltage" control signal. It is used to enable the reference voltage generator 10. When this signal is high, the reference generator is active. When low, the reference generator is in a power down state and $V_{ref}$ is held at ground ($V_{ss}$). This signal is low during the write operations performed on the flash cells 12 and 30. EnRefVL is the compliment of EnRefV.

Vb1 is a bias voltage for the differential amplifier 48 and the biasing of the flash cell 12 and flash cell 30. This voltage is slightly higher than an N-channel transistor threshold voltage (Vtn) by 0.1 to 0.2 volts. This voltage is used to limit the drain voltage seen by the flash cells 12 and 30 to the 0.1 to 0.2 volt range during the $V_{ref}$ 46 generation.

RefDrain is used to measure the current in flash cell 12 while setting the threshold voltage (Vt) of this cell during the erasure of these flash cells. The flash cells 12 and 30 are given an erase pulse on their sources by taking Vsource to high voltage (10 to 12 volts) while ProgCell1 and ProgCell2 signals are low. Vsource is then returned to ground and a voltage of 0.1 to 0.2 volts is then forced on the RefDrain while the RefDrain current is measured. This current should be in the range of 2 to 10 micro-amperes. If it is less than this range then another erase pulse is given, if more than this range than one programming pulse is given to flash cell 12. Programming of flash cell 12 is done by taking ProgCell1 to a high voltage with Vsource at ground. If required, additional erase (if the current is too low) and programming (if the current is too high) pulses are applied until the current is in the range. By properly controlling the magnitude of the voltages being applied during the programming and erase pulses, the current in the flash cell 12 can be easily set in the proper range. By this current being set, the Vt of the flash cell 12 is erased to a negative value of about −1 volt. Note that while the flash cell 12 current is being read the ProgCell1 signal holds its control gate to ground, $V_{ss}$.

ProgCell1 and ProgCell2 are signals used to program the flash cells 12 and 30. Programming of the cells is done one at a time by taking either ProgCell1 or ProgCell2 to the VPPref level (9 to 12 volts) while Vsource and EnRefV are at ground. The $V_{cc}$ voltage is applied to the drain of the flash cell being programmed by the N-channel device 52 and 54 respectively, being gated by the ProgCell1 or ProgCell2 signals. The amount of Vt shift programmed into the flash cell 12 and flash cell 30 is controlled by the voltages applied to the control gate 14 and 32 respectively (FIG. 1) through the VPPref level, and the drain, through the Vcc level, as well as the length of time they are applied.

Once the current of flash cell 12 has been set as described above, then flash cell 30 is programmed to set the $V_{ref}$ voltage. Note that flash cell 30 was erased at the same time that flash cell 12 was being erased. By now programming flash cell 30 the Vt difference between flash cells 12 and 30 becomes the value of $V_{ref}$. A programming pulse is applied to flash cell 30 and then the $V_{ref}$ voltage is measured. If $V_{ref}$ is not the desired value, then another programming pulse is applied to flash cell 30. The programming pulses applied to flash cell 30 should start with VPPref at a lower voltage (9 volts) and be slightly increased on subsequent pulses. By this method the desired value of $V_{ref}$ can be set.

The read circuitry, shown in FIG. 3B, is used to allow access to the RefDrain and the $V_{ref}$ 46' signals during the setting of the $V_{ref}$ value. When VrefVt is high then the RefDrain is connected to the external pin PadA<11> so that the current through the flash cell 12 can be measured. When Rdref is high then the $V_{ref}$ voltage can be measured through the external PadA<11>. The circuitry used in this circuit is designed to isolate the internal nodes from the external pin when these signals are not being measured. Improper isolation of these signals from the external pin could have dire consequences on the normal operation of the reference voltage generator. Reference is made to co-pending patent application entitled "Memory Circuit with Switch for Selectively Connecting an Input.Output Pad Directly to a Non Volatile Memory Cell", filed Jul. 28, 1995, Ser. No. 08/508, 848 which issued as U.S. Pat. No. 5,594,694 on Jan. 14, 1997 and which discloses such isolation circuitry, and which is incorporated herein by reference.

The write circuitry for the reference generator 10 is shown in FIG. 3C. It is used to apply the proper signals to flash cell 12 and flash cell 30 when setting the desired $V_{ref}$ voltage. This circuitry also provides level shifting for the output signals from Vcc to VPPref levels. VPPref is the programming voltage supply for the reference generator 10. This supply is at $V_{cc}$ during normal operation of the circuitry (non-programming) and is a Vpp level (9–13 volts) during the setting of $V_{ref}$ to the desired value. ProgCell2L is a $V_{cc}$ level signal and is the compliment of ProgCell2. This signal along with ProgCell2 is used to isolate the control gate of flash cell 30 from the feedback path of the output of the differential amplifier $V_{ref}$ 46 during the programming of flash cell 30. Ersref is the input that enables Vsource to VPPref level for erasing the flash cells. Pgmref is the control which enables the ProgCell1 and ProgCell2 to VPPref level for programming the flash cells 12 and 30. A<10> signal is used to select which flash cell 12 or 30 is being programmed.

What is claimed is:

1. A precision voltage reference comprising:
   a first flash memory transistor having a source, a drain, a floating gate and a control gate connected to ground and wherein the first flash memory cell is initially over-erased so as to have a negative threshold voltage;
   a second flash memory transistor having a source, a drain, a floating gate and a control gate and wherein the second flash memory cell has a threshold that is more positive than that of the first flash memory transistor;
   means for connecting the first and second flash memory transistors in a pair of parallel circuits in which equal current values are generated in an equilibrium condition;
   means responsive to currents in the parallel circuits for providing an output voltage as a reference voltage when the currents are in equilibrium; and
   means for sensing variations in the output voltage to vary the current through the second flash memory transistor to bring the current through each flash memory transistor back to an equilibrium state in which the output voltage resumes its reference voltage value.

2. A precision voltage reference as in claim 1 wherein the source of the first flash memory transistor is also connected to ground.

3. A precision voltage reference as in claim 1 wherein the means responsive to the currents in the parallel circuits comprises a differential amplifier.

4. A precision reference voltage as in claim 1 including means for biasing the first and second flash memory transistors for the linear region of operation.

5. A precision voltage reference as in claim 1 wherein the desired reference voltage is dependent upon the difference in threshold values of the first and second flash memory transistors.

6. A precision voltage reference comprising.
   a first flash memory transistor having a source, a drain, a floating gate and a control gate and wherein the first flash memory cell is initially over-erased so as to have a negative threshold voltage with respect to the source of the first flash memory transistor;

a second flash memory transistor having a source, a drain, a floating gate and a control gate and wherein the second flash memory cell has a threshold voltage which is more positive, with respect to the source of the second flash memory cell, than that of the first flash memory transistor;

control means for maintaining a fixed relative current flow through the first and second flash memory transistors whereby a reference voltage is produced at the control gate of the second flash memory cell;

wherein the first and second flash memory transistors are of the same construction and the control means functions to maintain equal magnitudes of current through the first and second flash memory transistors;

wherein the control gate and source of the first flash memory cell are at the same potential; and wherein the control gate and the source of the first transistor are at ground potential.

* * * * *